(12) United States Patent
Tsai et al.

(10) Patent No.: US 11,043,406 B2
(45) Date of Patent: Jun. 22, 2021

(54) TWO PIECE SHUTTER DISK ASSEMBLY WITH SELF-CENTERING FEATURE

(71) Applicant: APPLIED MATERIALS, INC., Santa Clara, CA (US)

(72) Inventors: Cheng-Hsiung Tsai, Cupertino, CA (US); Ananthkrishna Jupudi, Singapore (SG); Sarath Babu, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 135 days.

(21) Appl. No.: 16/383,772

(22) Filed: Apr. 15, 2019

(65) Prior Publication Data

US 2019/0326154 A1    Oct. 24, 2019

Related U.S. Application Data

(60) Provisional application No. 62/659,683, filed on Apr. 18, 2018.

(51) Int. Cl.
  *C23C 14/50*   (2006.01)
  *H01L 21/687*  (2006.01)
  (Continued)

(52) U.S. Cl.
  CPC ........ *H01L 21/68785* (2013.01); *C23C 14/50* (2013.01); *H01L 21/67306* (2013.01);
  (Continued)

(58) Field of Classification Search
  CPC ........ H01L 21/68785; H01L 21/67309; H01L 21/67742; H01L 21/68; H01L 21/67306; C23C 14/50; H01J 37/3447
  (Continued)

(56) References Cited

U.S. PATENT DOCUMENTS

| 5,358,615 A | 10/1994 | Grant et al. |
| 6,045,670 A * | 4/2000 | Adams .................... H01J 37/34 |
| | | 204/298.11 |

(Continued)

FOREIGN PATENT DOCUMENTS

| CN | 106947958 A * | 7/2017 | ......... H01L 21/0262 |
| JP | 2004-131832 A | 4/2004 | |

(Continued)

OTHER PUBLICATIONS

International Search Report for PCT/US2019/027434 dated Jul. 31, 2019.

(Continued)

*Primary Examiner* — James Lin
*Assistant Examiner* — Patrick S Ott
(74) *Attorney, Agent, or Firm* — Moser Taboada

(57) ABSTRACT

Two-piece shutter disk assemblies for use in process chambers are provided herein. In some embodiments, a shutter disk assembly for use in a process chamber includes an upper disk member having a top surface and a bottom surface, wherein a central alignment recess is formed in a center of the bottom surface, and a lower carrier member having a solid base having an upper support surface, wherein the upper support surface includes a first central self-centering feature disposed in the recess formed in the center of the bottom surface and an annular outer alignment feature that protrudes upward from a top surface of the lower carrier and forms a pocket, wherein the upper disk member is disposed in the pocket.

18 Claims, 3 Drawing Sheets

(51) Int. Cl.
    *H01L 21/673*     (2006.01)
    *H01L 21/677*     (2006.01)
    *H01L 21/68*     (2006.01)

(52) U.S. Cl.
    CPC .. *H01L 21/67309* (2013.01); *H01L 21/67742* (2013.01); *H01L 21/68* (2013.01)

(58) Field of Classification Search
    USPC .............................. 204/298.11; 118/504, 728
    See application file for complete search history.

(56) References Cited

U.S. PATENT DOCUMENTS

| | | | |
|---|---|---|---|
| 6,824,627 | B2 | 11/2004 | Dhindsa et al. |
| 8,211,324 | B2 | 7/2012 | Dhindsa et al. |
| 9,252,002 | B2 | 2/2016 | Cheng-Hsiung et al. |
| 2002/0088771 | A1* | 7/2002 | Hixson ............ H01L 21/68728 216/67 |
| 2004/0182698 | A1* | 9/2004 | Feltsman ............ C23C 14/566 204/298.11 |
| 2004/0245098 | A1 | 12/2004 | Eckerson |
| 2007/0032081 | A1 | 2/2007 | Chang et al. |
| 2009/0130336 | A1 | 5/2009 | Dekempeneer et al. |
| 2009/0142512 | A1* | 6/2009 | Forster ................... C23C 14/34 427/576 |
| 2009/0173446 | A1 | 7/2009 | Yang et al. |
| 2010/0071625 | A1 | 3/2010 | Brown |
| 2010/0326818 | A1 | 12/2010 | Ikemoto et al. |
| 2011/0126984 | A1 | 6/2011 | Kang et al. |
| 2012/0103793 | A1 | 5/2012 | Fujii |
| 2012/0325140 | A1* | 12/2012 | Schaller ................ C23C 14/568 118/50 |
| 2014/0020629 | A1* | 1/2014 | Tsai ........................ H01J 37/34 118/728 |
| 2015/0364301 | A1 | 12/2015 | Yamaguchi et al. |

FOREIGN PATENT DOCUMENTS

| | | | |
|---|---|---|---|
| JP | 2016-164287 A | | 9/2016 |
| KR | 20150136142 A | * | 12/2015 .......... H01J 37/3441 |
| KR | 20180018554 A | * | 2/2018 .......... H01J 37/3426 |

OTHER PUBLICATIONS

International Search Report and Written Opinion dated Sep. 25, 2013 for PCT Application No. PCT/US2013/050490.

* cited by examiner

TWO PIECE SHUTTER DISK ASSEMBLY WITH SELF-CENTERING FEATURE

CROSS-REFERENCE

This application claims benefit of U.S. provisional patent application Ser. No. 62/659,683, filed Apr. 18, 2018 which is herein incorporated by reference in its entirety.

FIELD

Embodiments of the present disclosure generally relate to the field of substrate process chambers.

BACKGROUND

Conventional semiconductor device formation is commonly performed in one or more process chambers which have the capability to process substrates (e.g., semiconductor wafers) in a controlled processing environment. To maintain process uniformity and ensure optimal performance of the process chamber, various conditioning operations are periodically performed. For example, in a physical vapor deposition (PVD) process chamber, one commonly used conditioning operation is a "burn-in" process, wherein a target disposed in the PVD process chamber is bombarded with plasma ions to remove oxides or other contaminants from the target prior to performing substrate processes. Another commonly used conditioning operation is a "pasting" process, wherein a covering is applied over material deposited on process chamber surfaces to prevent the material from flaking off the process chamber surfaces and contaminating the substrate during subsequent processes. Another operation is a "preclean" operation. In-situ removal of organic residues and native oxide using a preclean process in a preclean chamber ensures a clean surface that promotes low contact resistance and excellent adhesion.

In all of the aforementioned conditioning/preclean operations, a shutter disk may be positioned via a transfer robot atop a substrate support disposed in the process chamber to prevent the deposition of any materials upon the substrate support. The shutter disk typically comprises a material having a mechanical stiffness sufficient enough to resist deformation due to the additional weight of the deposited material. For example, the shutter disk commonly comprises a metal alloy, such as stainless steel, or a ceramic, such as silicon carbide.

However, the inventors have observed that during a conditioning and preclean processes, the shutter disk heats up. Due to heat gradient and/or deposition on the disc, the shutter disk may develop stresses from a thermal mismatch between the top and bottom surfaces of the shutter disk, for example, causing the shutter disk to deform (e.g., bow up at the ends). This warping/deformation creates a gap which results in plasma exposure to the substrate support through the gap. Metal deposition on the substrate support could lead to substrate wafer arcing, substrate wafer sticking and/or breaking, electrostatic chucking force reduction if the substrate support is an electrostatic chuck, etc.

In addition, shutter disks are often stored clear of the processing area and moved by buffer chamber robots into a desired position during use. In order for the robots to be able to handle the disks, the weight and thickness of shutter disks must be minimized. These lighter weight/lower thickness shutter disks deform more during the pasting and burn-in processes.

Various solution have been tried to address the aforementioned problems. For example, use of lower RF powers, longer cooling periods, and addition of a cooling gas to the backside of a shutter disk have been tried. However, the inventors have observed that none of these solutions sufficiently protected the substrate support from undesired material deposition.

Accordingly, improved two-piece shutter disk assemblies are provided herein.

SUMMARY

Two-piece shutter disk assemblies for use in process chambers are provided herein. In some embodiments, a shutter disk assembly for use in a process chamber includes an upper disk member having a top surface and a bottom surface, wherein a central alignment recess is formed in a center of the bottom surface, and a lower carrier member having a solid base having an upper support surface, wherein the upper support surface includes a first central self-centering feature disposed in the recess formed in the center of the bottom surface and an annular outer alignment feature that protrudes upward from a top surface of the lower carrier and forms a pocket, wherein the upper disk member is disposed in the pocket.

In some embodiments, a process chamber comprising a chamber body defining an inner volume having a target comprising materials to be sputtered, a substrate support disposed within the chamber body to support the substrate, a shutter disk assembly for use in a process chamber, comprising: an upper disk member having a top surface and a bottom surface, wherein a central alignment recess is formed in a center of the bottom surface; and a lower carrier member having: a solid base having an upper support surface, wherein the upper support surface includes a first central self-centering feature disposed in the recess formed in the center of the bottom surface of the upper disk member, and an outer annular alignment feature that protrudes upward from a top surface of the lower carrier and forms a pocket, wherein the upper disk member is disposed in the pocket; and a transfer robot movably coupled to the chamber body to transfer the shutter disk assembly to and from the substrate support.

In some embodiments, a shutter disk assembly for use in a process chamber to protect a substrate support disposed below the shutter disk assembly includes an upper disk member having a top surface and a bottom surface, wherein a central alignment recess is formed in a center of the bottom surface; and a lower carrier member having a solid base having an upper support surface, wherein the upper support surface includes a first central self-centering feature disposed in the recess formed in the center of the bottom surface of the upper disk member, and an outer annular alignment feature that protrudes upward from a top surface of the lower carrier and forms a pocket, wherein the upper disk member is disposed in the pocket, wherein the upper disk member is a process chamber target configured to be used for pasting processes, and wherein the lower carrier member along with the outer annular alignment feature forms an electrically insulated barrier around the upper disk member target configured to prevent arcing during pasting processes.

Other embodiments and variations of the present disclosure are disclosed in greater detail below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
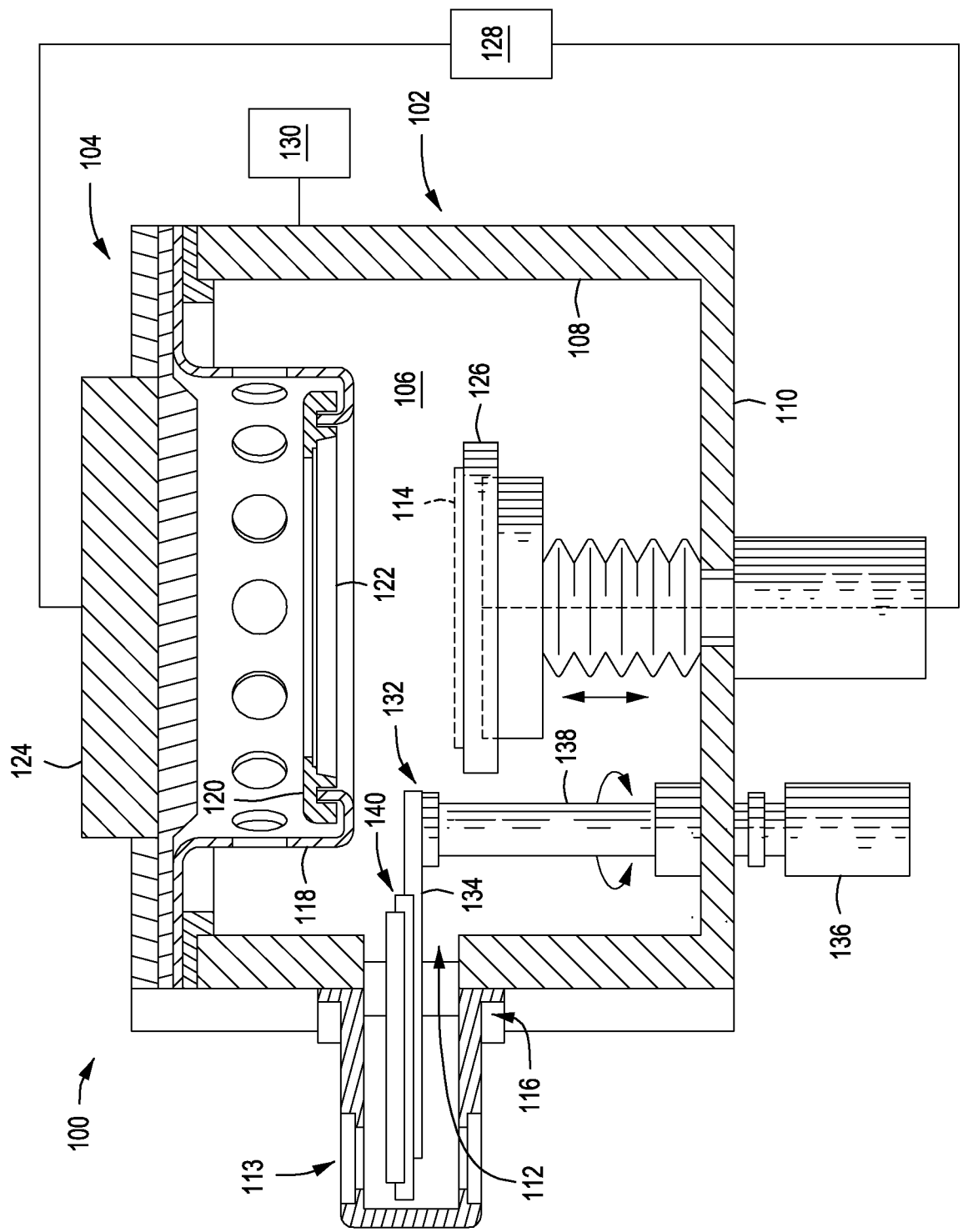
FIG. 1 is a schematic diagram of an exemplary process chamber suitable for use in connection with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure generally relate to shutter disk assemblies for use in substrate process chambers, such as, for example, semiconductor manufacturing process chambers, and to substrate process chambers incorporating such shutter disk assemblies. In some embodiments, the inventive apparatus includes a shutter disk assembly for use in conditioning and preclean operations of process chambers. The inventive apparatus may advantageously provide a shutter disk assembly that manages disk expansion due to heating during use with reduced or eliminated exposure of the substrate support upon which the shutter disk assembly is disposed, thereby protecting the substrate support disposed below the shutter disk assembly from undesired material deposition.

FIG. 1 is a schematic diagram of an exemplary process chamber 100 for use in connection with some embodiments of the present disclosure. In some embodiments, the process chamber 100 may be one of a plurality of chambers combined to form a multi-chamber processing system (e.g., a cluster tool). Alternatively, the process chamber 100 may be a standalone process chamber. In some embodiments, the process chamber 100 may be a deposition chamber, for example, a physical vapor deposition (PVD) chamber. Alternatively, the process chamber 100 may be any suitable process chamber in which a shutter disk assembly may be used to protect the substrate support from damage during chamber cleaning and or seasoning processes.

The process chamber 100 includes a chamber body 102 and a lid assembly 104 that defines an evacuable process volume 106. The chamber body 102 generally includes one or more sidewalls 108 and a bottom 110. The one or more sidewalls 108 may be a single circular sidewall or multiple sidewalls in process chambers having non-circular configurations. The sidewalls generally contain a shutter disk assembly port 112. In some embodiments, a shutter garage 113 located outside of process chamber 100 may store the shutter disk assembly 140 and move it into process chamber 100 through shutter disk assembly port 112 in process chamber 100. A housing 116 generally covers the shutter disk assembly port 112 to maintain the integrity of the vacuum within the process volume 106. Additional ports may be provided in the sidewalls, such as a sealable access port to provide for the entrance and egress of the substrate 114 from the process chamber 100. A pumping port may be provided in the sidewalls and/or the bottom of the chamber body 102 and is coupled to a pumping system that evacuates and controls the pressure within the process volume 106.

The lid assembly 104 of the chamber body 102 generally supports an annular shield 118 that supports a shadow ring 120. The shadow ring 120 is generally configured to confine deposition to a portion of the substrate 114 exposed through the center of the shadow ring 120. The lid assembly 104 generally comprises a target 122 and a magnetron 124.

The target 122 provides material that is deposited on the substrate 114 during the deposition process while the magnetron 124 enhances uniform consumption of the target material during processing. The target 122 and substrate support 126 are biased relative each other by a power source 128. An inert gas, for example, argon, is supplied to the process volume 106 from a gas source 130. A plasma is formed between the substrate 114 and the target 122 from the gas. Ions within the plasma are accelerated toward the target 122 and cause material to become dislodged from the target 122. The dislodged target material is attracted towards the substrate 114 and deposits a film of material thereon.

The substrate support 126 is generally disposed on the bottom 110 of the chamber body 102 and supports the substrate 114 during processing. A shutter disk assembly mechanism 132 is generally disposed proximate the substrate support 126. The shutter disk assembly mechanism 132 generally includes a robot shutter arm 134 that supports the shutter disk assembly 140 and an actuator 136 coupled to the robot shutter arm 134 by a shaft 138 to control the position of the robot shutter arm 134. The robot shutter arm 134 may be moved between the retracted, or cleared position shown in FIG. 1 and a second position that places the shutter disk assembly 140 directly over and substantially concentric with the substrate support 126. The actuator 136 may be any device that may be adapted to rotate the shaft 138 through an angle that moves the robot shutter arm 134 between the cleared and second positions.

Figure 2A:
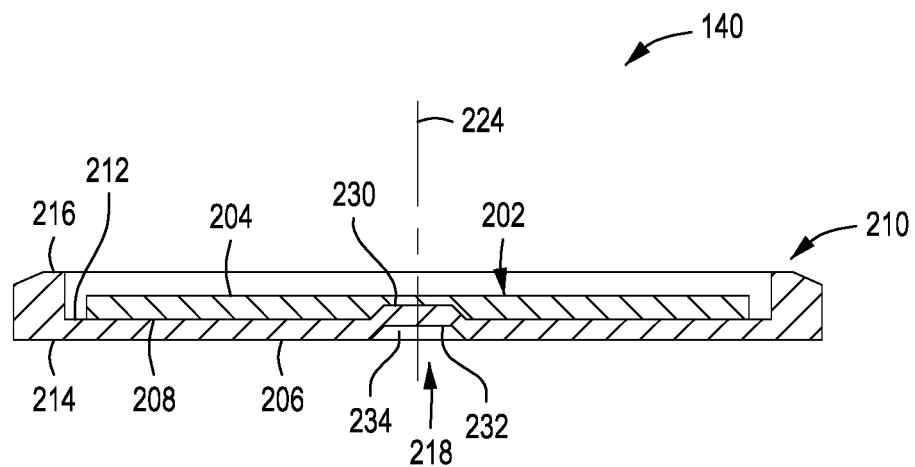
FIG. 2A depicts a partial cross-sectional view of an exemplary two piece shutter disk assembly, in accordance with some embodiments of the present disclosure.
Figure 2B:
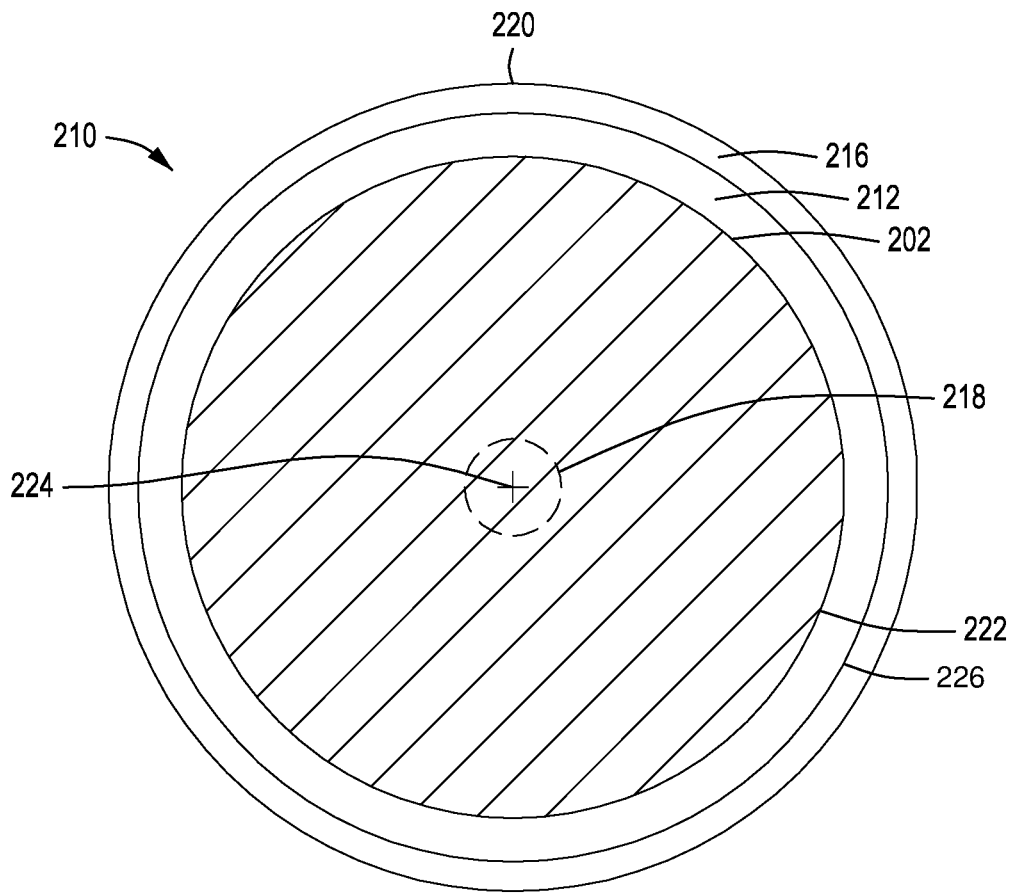
FIG. 2B is a top view of an exemplary two-piece shutter disk assembly in accordance with some embodiments of the present disclosure.
Figure 2C:
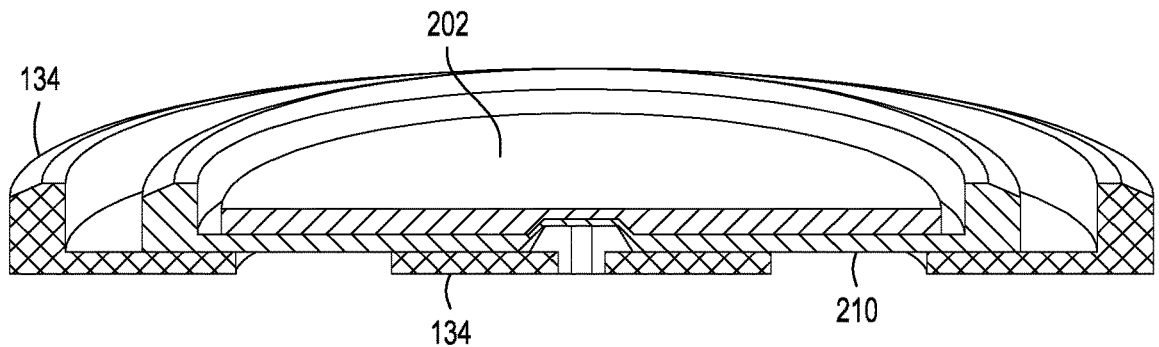
FIG. 2C depicts a cross-sectional perspective view of the exemplary shutter disk assembly on a robot arm mechanism blade in accordance with some embodiments of the present disclosure.
Figure 2D:
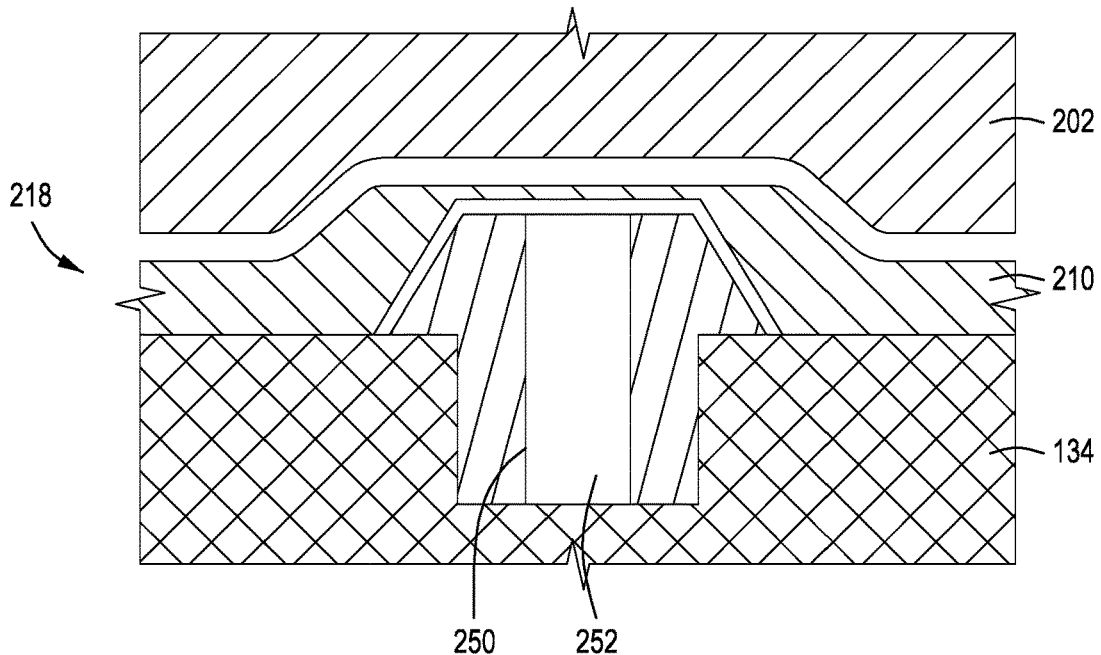
FIG. 2D depicts a cross-sectional of the self-centering features of the shutter disk assembly in accordance with some embodiments of the present disclosure.
Figure 3:
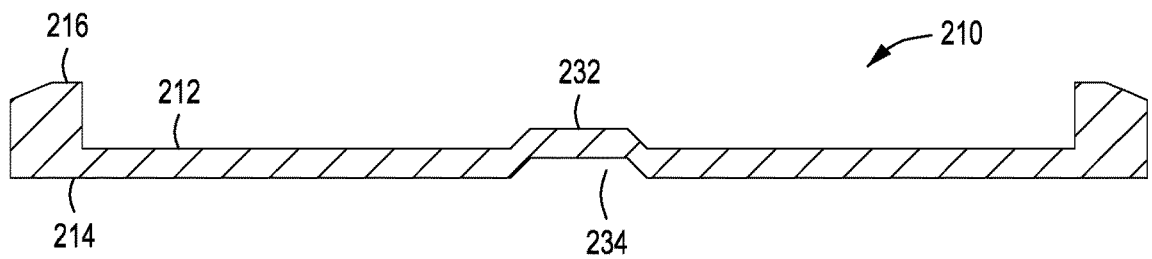
FIG. 3 depicts a cross sectional side view of an exemplary lower carrier member in accordance with some embodiments of the present disclosure.

FIG. 2A depicts a cross sectional side view of an exemplary shutter disk assembly 140 in accordance with some embodiments of the present disclosure. FIG. 2B is a top view of the exemplary shutter disk assembly of FIG. 2A, in accordance with some embodiments of the present disclosure. FIG. 2C depicts a cross-sectional perspective view of the exemplary shutter disk assembly on the robot shutter arm 134. FIG. 2D depicts a cross-sectional of the self-centering features of the shutter disk assembly 140. FIG. 3 depicts a cross sectional side view of an exemplary lower carrier member in accordance with some embodiments of the present disclosure. To best understand the disclosure, the reader should refer simultaneously to FIGS. 2A-2D and FIG. 3.

Exemplary shutter disk assembly 140 generally comprises an upper disk member 202 and a lower carrier member 210. Although described herein as a two-piece assembly, the shutter disk assembly may include additional components.

In addition, although described herein as a disk, the shutter disk assembly and its components may have any suitable geometry as required for protecting a substrate support within a particular process chamber.

The lower carrier member 210 and the upper disk member 202 are movably disposed or coupled with respect to each other such that the lower carrier member 210 and the upper disk member 202 may move in relation to each, for example, to allow for independent thermal expansion and contraction of the components. In some embodiments, the upper disk member 202 may merely rest upon the lower carrier member 210.

The lower carrier member 210 supports the upper disk member 202. In some embodiments, the lower carrier member 210 is a solid disk base which includes a support surface 212 to support the upper disk member 202 such that a bottom side 206 of the upper disk member 202 is disposed on the support surface 212 of the lower carrier member 210. As shown in FIGS. 2A, 2C, and 3, the lower carrier member 210 is solid and has no opening that passes through the disk.

The carrier member 210 may also include a first central self-centering feature 232 which assists in positioning the upper disk member 202 and keeping the upper disk member 202 generally in place (e.g., from sliding out of position) while still allowing the upper disk member 202 to move or deform, for example, due to thermal expansion and contraction. For example, in some embodiments, first central self-centering feature 232 (also referred as a self-alignment feature) may be a protrusion extending upward from the carrier member which fits into a recess 230 formed in the bottom surface 208 of the upper disk member 202. Furthermore, first central self-centering feature 232 forms a cavity 234 in the bottom surface of the carrier member 210. In some embodiments, an alignment plug 250 as shown in FIG. 2D is disposed in robot shutter arm 134 fits into the cavity 234 formed in the bottom surface of carrier member 210 to self-align the entire shutter disk assembly 140 on the robot shutter arm 134. The alignment plug 250 may be cone-shaped as shown, or may have other geometric shapes to facilitate alignment. In some embodiments, the alignment plug 250 includes an opening 252 formed through the center of the alignment plug 250 for weight reduction or reduce the inertia when it's moving. In some embodiments, the alignment plug 250 may be formed as part of the robot shutter arm 134, or as a separate piece as shown in FIG. 2D. In some embodiments, the alignment plug 250 is made of the same material as the robot shutter arm 134, or may be made of, or coated with, an electrically insulative material. As shown in FIGS. 2A and 2D, the central self-alignment assembly 218 aligns the upper disk member 202, the carrier member 210 and the robot shutter arm 134 which includes gaps between each alignment feature to allow the upper disk member 202 to radially move or deform with respect to lower carrier member 210, and the lower carrier member 210 to move with respect to and the robot shutter arm 134 for example, due to thermal expansion and contraction.

The carrier member 210 may also include an annular outer alignment feature 216 which assists in positioning the upper disk member 202 and keeping the upper disk member 202 generally in place (e.g., from sliding out of position) while still allowing the upper disk member 202 to move or deform, for example, due to thermal expansion and contraction. For example, in some embodiments, the annular outer alignment feature 216 may be a protrusion or lip extending upward from the support surface of the lower carrier member 210 to form a pocket in which the upper disk member 202 may be disposed. The inner diameter 226 of the pocket formed is larger than the outer diameter 222 of the upper disk member 202 such that a gap is formed between the upper disk member 202 and the lower carrier member 210. The gap allows the upper disk member 202 to radially move or deform with respect to lower carrier member 210, for example, due to thermal expansion and contraction.

The lower carrier member 210 may comprise a thermally stable material to minimize thermal deformation of the lower carrier member 210. For example, lower carrier member 210 may comprise at least one of ceramic, silicon carbide coated graphite, solid silicon carbide, solid sintered silicon carbide, or solid sintered silicon carbide fabricated with metal-free sintering agents, such as PUREBETA®, available from Bridgestone, or the like. In some embodiments, the lower carrier member 210 may comprise a material with a coefficient of thermal expansion of about 5.6E-6 m/(m·K) to about 22.2E-6 m/(m·K). In some embodiments, the lower carrier member 210 may comprise a thermally conductive material. In some embodiments, the lower carrier member 210 may comprise an electrically insulating material. In any of the embodiments described above, the lower carrier member 210 may be constructed of suitable materials having a mechanical stiffness sufficient enough to substantially resist deformation due to the additional weight of the upper disk member 202 and materials which may be deposited atop the upper disk member 202 during use. In some embodiments, the material may also be lightweight so as to allow the shutter disk assembly 140 to be easily maneuvered by a transfer robot. In some embodiments, one or more surfaces of the lower carrier member 210 and/or the upper disk member 202 which are in contact with each other may be finished in such a way to facilitate ease of movement due to thermal deformation between the lower carrier member 210 and the upper disk member 202.

In some embodiments, the bottom surface 214, the bottom surface of the lower carrier member 210 may be substantially planar. In other embodiments, the bottom surface 214 of the lower carrier member 210 may comprise features to interface with the components of the shutter disk assembly mechanism 132 to facilitate stable and precise movement.

The top surface 204 of the upper disk member 202 is generally planar and has an orientation substantially perpendicular to the centerline 224 of shutter disk assembly 140. The bottom surface 206 is also generally planar and has an orientation substantially perpendicular to the centerline 224 of shutter disk assembly 140.

The upper disk member 202 may be constructed of any suitable material having a mechanical stiffness sufficient enough to resist deformation due to the additional weight of materials which may be deposited atop the upper disk member 202. In some embodiments, the material may also be lightweight so as to allow the shutter disk assembly 140 to be easily maneuvered by a transfer robot. In some embodiments, the upper disk member 202 may be constructed from a metal alloy, such as stainless steel, a metal composite, such as aluminum silicon (AlSi), or a ceramic, such as silicon carbide. The upper disk member 202 may be fabricated via any method suitable for forming the desired shape, for example, mold casting, die casting, spray casting, spray deposition, or the like. In some embodiments, the upper disk member 202 is comprised of the same material used in the process chamber for depositing/etching substrates.

In some embodiments, the upper surface 204 of the upper disk member 202 may not be planar, but rather may include ridges or other features suitable for process chamber pasting processes.

In some embodiments, the upper disk member 202 may be a target itself and used for pasting processes. The lower carrier member 210 along with the outer annular alignment feature 216 forms an electrically insulated barrier around the upper disk member 202 target. This allows for pasting process using the upper disk member 202 as a target while preventing arcing to the substrate support.

In addition, one of the advantages of the two-piece shutter disk assembly is to prevent arcing. As such, the bottom surface of the shutter disk assembly 140 (i.e., the bottom surface of the lower carrier member 210) is insulated. In some embodiments, the lower carrier member 210 is coated with an electrically insulative coating. In other embodiments, the entire lower carrier member 210 is made from an electrically insulative material. Still in other embodiments, only the bottom surface of the lower carrier member 210 is coated with an electrically insulative coating.

In some embodiments, shutter disk assembly 140 has an outer diameter 220 of about 6 to about 12 inches, for example about 6, 8, or 11.85 inches. In some embodiments, the thickness from the of the top surface 204 of the upper disk member 202 to the bottom surface of the lower support carrier 210 may be about 0.1 to about 0.25 inches, for example, about 0.15 inches. Other sizes may be used depending upon the configuration and size of the substrate support. In some embodiments, the shutter disk assembly 140 will have an outer diameter 220 equal to that of a diameter of substrate 114 with a tolerance of +/−50 mm. In some embodiments, the inner diameter (ID) of the lower support carrier 210 (i.e., the ID of the annular alignment feature 216) is 11.00 inches to about 11.85 inches. In some embodiments, the upper disk member 202 has a diameter that is about 5 inches to about 1 millimeter smaller than the ID of the annular alignment feature 216.

Although discussed in terms of diameters and referred to as a disk, the shutter disk assembly 140 and the upper disk member are not limited to round shapes and may have any shape suitable for use in a process chamber as disclosed herein. Although the shutter disk assembly and components thereof are discussed in terms of diameters and using the term "disc", it is contemplated that the shape of the shutter disk assembly and these components need not be circular and may have a perimeter and/or opening of any shape, including but not limited to, rectangles, polygons, ovals, and the like.

While the foregoing is directed to embodiments of the present disclosure, other and further embodiments of the disclosure may be devised without departing from the basic scope thereof, and the scope thereof is determined by the claims that follow.

The invention claimed is:

1. A shutter disk assembly for use in a process chamber, comprising:
   an upper disk member having a top surface and a bottom surface, wherein a central alignment recess is formed in a center of the bottom surface; and
   a lower carrier member having:
   a solid base having an upper support surface, wherein the upper support surface includes a first central self-centering feature, wherein the first central self-centering feature forms a cavity in the bottom surface of the lower carrier member that is configured to receive another self-centering feature, and wherein the first central self-centering feature is disposed in the central alignment recess formed in the center of the bottom surface of the upper disk member; and
   an outer annular alignment feature that protrudes upward from a top surface of the lower carrier and forms a pocket, wherein the upper disk member is disposed in the pocket.

2. The shutter disk assembly of claim 1, wherein the lower carrier member is formed of electrically insulative material, or coated with an electrically insulative coating.

3. The shutter disk assembly of claim 2, wherein the base of the lower carrier member and the outer annular alignment feature form an electrically insulated barrier around the upper disk member.

4. The shutter disk assembly of claim 1, wherein the lower carrier member and the upper disk member are movably disposed or coupled with respect to each other.

5. The shutter disk assembly of claim 1, wherein the lower carrier member and the upper disk member are configured to thermally expand and contract independently with respect to each other.

6. The shutter disk assembly of claim 1, wherein the upper disk member is supported by the upper support surface of the solid base of the lower carrier member.

7. The shutter disk assembly of claim 1, wherein the lower carrier member has no opening that passes through the lower carrier member.

8. The shutter disk assembly of claim 1, wherein the lower carrier member comprises a thermally stable material to minimize thermal deformation of the lower carrier member.

9. The shutter disk assembly of claim 1, wherein the lower carrier member comprises at least one of ceramic, silicon carbide coated graphite, solid silicon carbide, solid sintered silicon carbide, or solid sintered silicon carbide fabricated with metal-free sintering agents.

10. The shutter disk assembly of claim 1, wherein the lower carrier member comprises a material with a coefficient of thermal expansion of about 5.6E-6 m/(m·K) to about 22.2E-6 m/(m·K).

11. The shutter disk assembly of claim 1, wherein the upper disk member is constructed from at least one of a metal alloy, a metal composite, or a ceramic.

12. The shutter disk assembly of claim 1, wherein the upper disk member is a process chamber target configured to be used for pasting processes.

13. The shutter disk assembly of claim 1, wherein the upper disk member has a diameter that is about 5 inches to about 1 millimeter smaller than an inner diameter (ID) of the annular alignment feature.

14. The shutter disk assembly of claim 1, wherein the shutter disk assembly has an outer diameter of about 6 to about 12 inches, wherein a thickness of the top surface of the upper disk member to the bottom surface of the lower support carrier is about 0.1 to about 0.25 inches.

15. The shutter disk assembly of claim 1, wherein an inner diameter (ID) of the annular alignment feature of the lower support carrier is about 11.00 inches to about 11.85 inches.

16. A process chamber comprising:
   a chamber body defining an inner volume having a target comprising materials to be sputtered;
   a substrate support disposed within the chamber body to support the substrate;
   a shutter disk assembly for use in a process chamber, comprising:
   an upper disk member having a top surface and a bottom surface, wherein
   a central alignment recess is formed in a center of the bottom surface; and
   a lower carrier member having:

a solid base having an upper support surface, wherein the upper support surface includes a first central self-centering feature, wherein the first central self-centering feature forms a cavity in the bottom surface of the lower carrier member and is configured to receive another self-centering feature, and wherein the first central self-centering feature is disposed in the central alignment recess formed in the center of the bottom surface of the upper disk member; and an outer annular alignment feature that protrudes upward from a top surface of the lower carrier and forms a pocket, wherein the upper disk member is disposed in the pocket;

and a transfer robot movably coupled to the chamber body to transfer the shutter disk assembly to and from the substrate support.

17. The process chamber of claim 16, wherein the transfer robot includes a robot shutter arm having an alignment plug that is disposed into a cavity formed in the bottom surface of the lower carrier member to self-align the entire shutter disk assembly on the robot shutter arm.

18. A shutter disk assembly for use in a process chamber to protect a substrate support disposed below the shutter disk assembly, comprising:

an upper disk member having a top surface and a bottom surface, wherein a central alignment recess is formed in a center of the bottom surface; and a lower carrier member having a solid base having an upper support surface, wherein the upper support surface includes a first central self-centering feature, wherein the first central self-centering feature forms a cavity in the bottom surface of the lower carrier member that is configured to receive another self-centering feature, wherein the first central self-centering feature is disposed in the recess formed in the center of the bottom surface of the upper disk member, and wherein the lower carrier member includes an outer annular alignment feature that protrudes upward from a top surface of the lower carrier and forms a pocket, and wherein the upper disk member is disposed in the pocket, wherein the upper disk member is a process chamber target configured to be used for pasting processes, and wherein the lower carrier member along with the outer annular alignment feature forms an electrically insulated barrier around the upper disk member target configured to prevent arcing during pasting processes.

* * * * *